United States Patent [19]
Hotchkiss et al.

[11] Patent Number: 5,486,494
[45] Date of Patent: Jan. 23, 1996

[54] METHOD AND APPARATUS FOR AFFIXING SPHERES TO A CONDUCTIVE SHEET

[75] Inventors: Gregory Hotchkiss, Richardson; Jules D. Levine, Dallas, both of Tex.

[73] Assignee: Texas Instruments Incorporated, Dallas, Tex.

[21] Appl. No.: 279,572

[22] Filed: Jul. 22, 1994

[51] Int. Cl.[6] ............................................. H01L 21/60
[52] U.S. Cl. .................. 437/209; 437/211; 437/212; 437/221; 437/222
[58] Field of Search .................................. 437/209, 211, 437/212, 214, 217, 218, 219, 220, 221, 222; 156/580, 581, 582, 583.1

[56] References Cited

U.S. PATENT DOCUMENTS

| | | | |
|---|---|---|---|
| 4,691,076 | 9/1987 | Levine et al. | 136/250 |
| 5,091,319 | 2/1992 | Hotchkiss et al. | 437/222 |
| 5,258,331 | 11/1993 | Masermoto et al. | 432/220 |
| 5,281,556 | 1/1994 | Shimizu et al. | 437/220 |

*Primary Examiner*—Kevin M. Picardat
*Attorney, Agent, or Firm*—Ira S. Matsil; James C. Kesterson; Richard L. Donaldson

[57] ABSTRACT

An improved method of affixing spheres 4 to a conductive foil sheet 28 is described herein. A cell matrix is provided. The cell matrix includes a conductive foil matrix 2 with spheres 4 mounted therein. Each of the spheres 4 has an insulating layer 20 disposed on it. A portion of this insulating layer 20 is removed from each of the spheres 4 to expose a portion 22 of the spheres 4. A cell sandwich 32 is then formed between an upper pressure pad 34 and a lower pressure pad 36. The cell sandwich 32 includes the cell matrix 2/4 and a conductive foil 28. The cell sandwich 32 is then heated (preferably to between about 350° and 450° C.). The spheres 4 are then affixed to the conductive foil 28 by compressing the cell sandwich 32. In one embodiment, the compression takes place in a roll press 48.

29 Claims, 10 Drawing Sheets

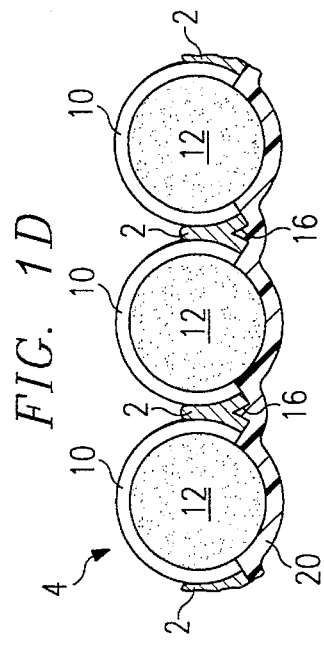
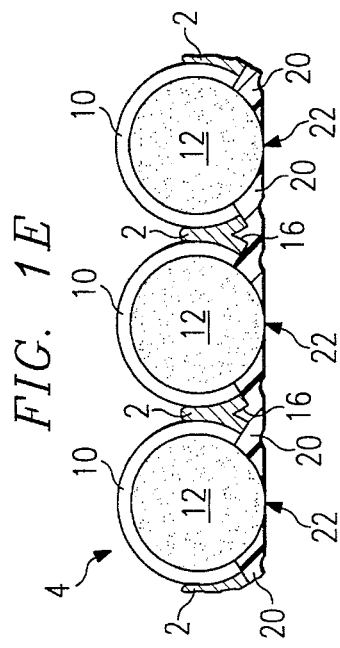
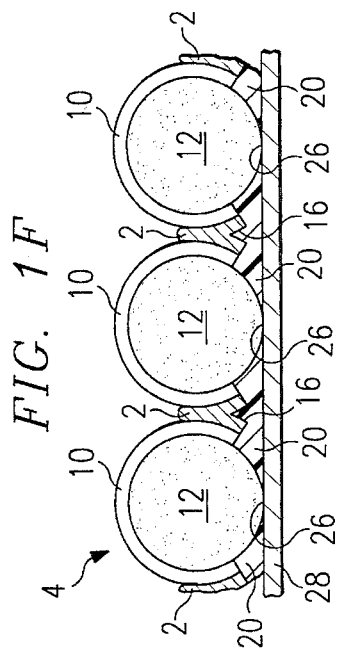
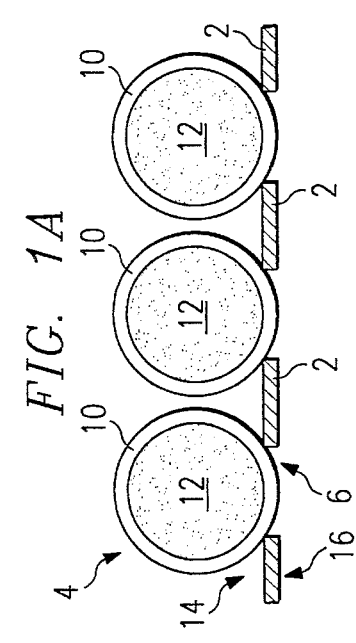
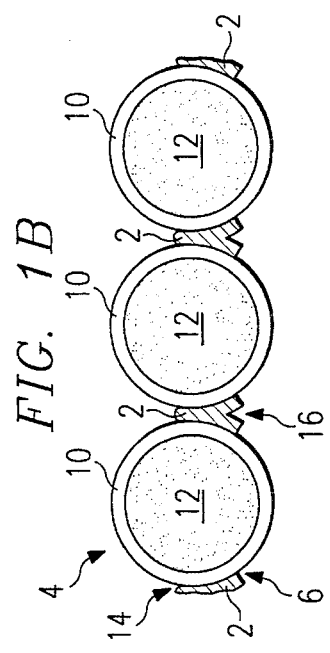
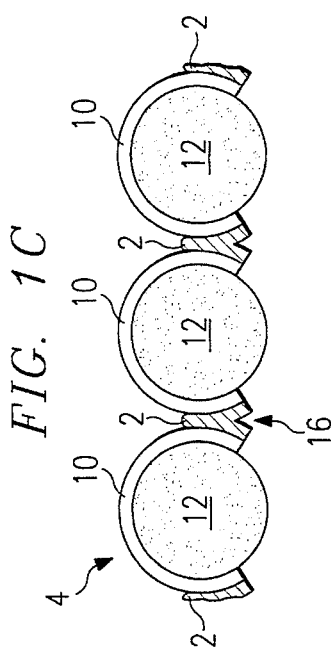

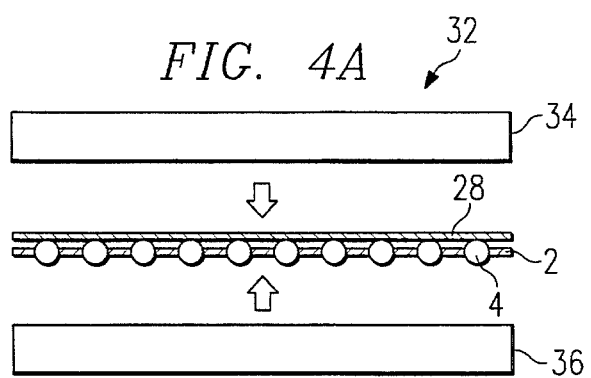
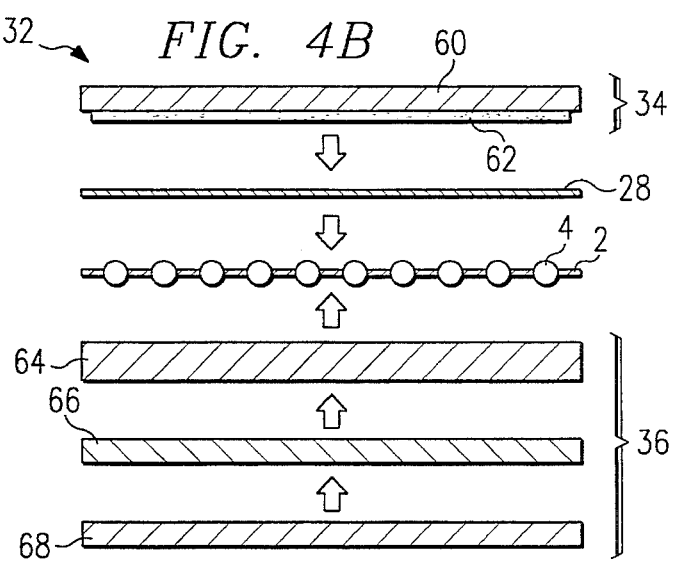
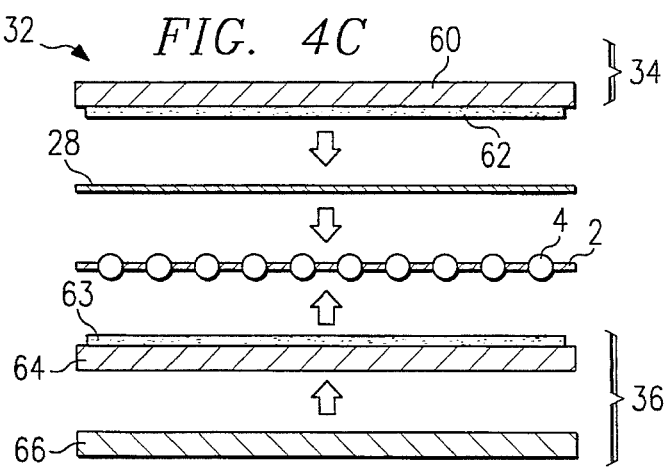

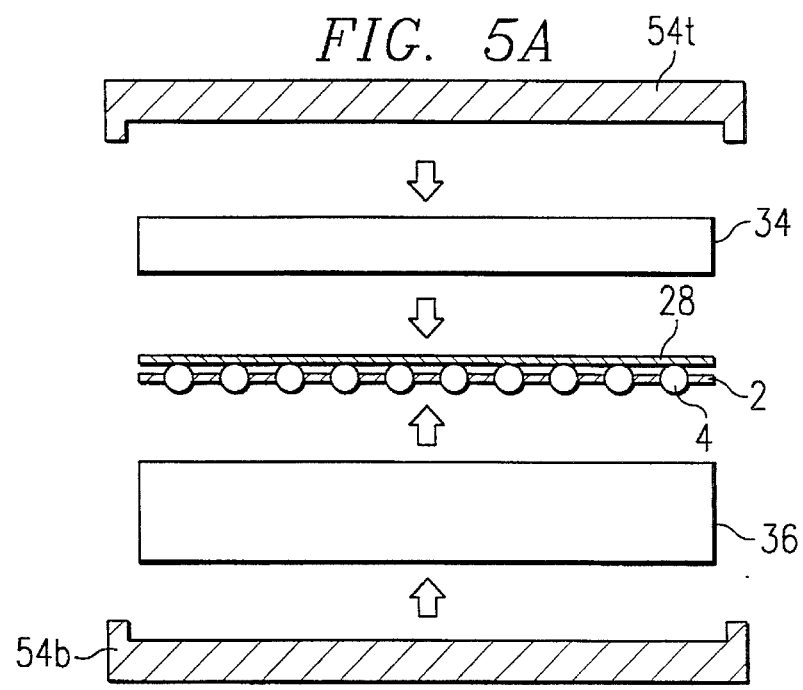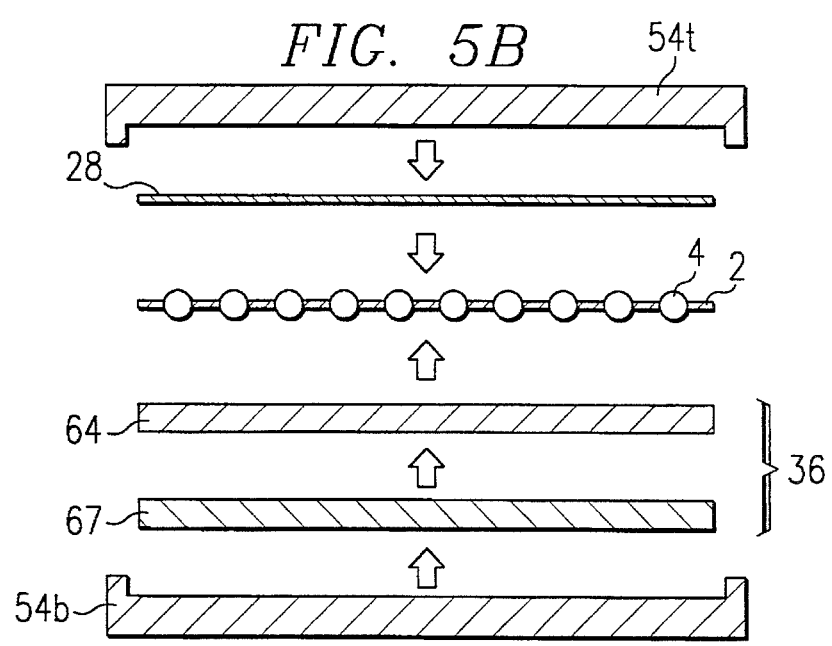

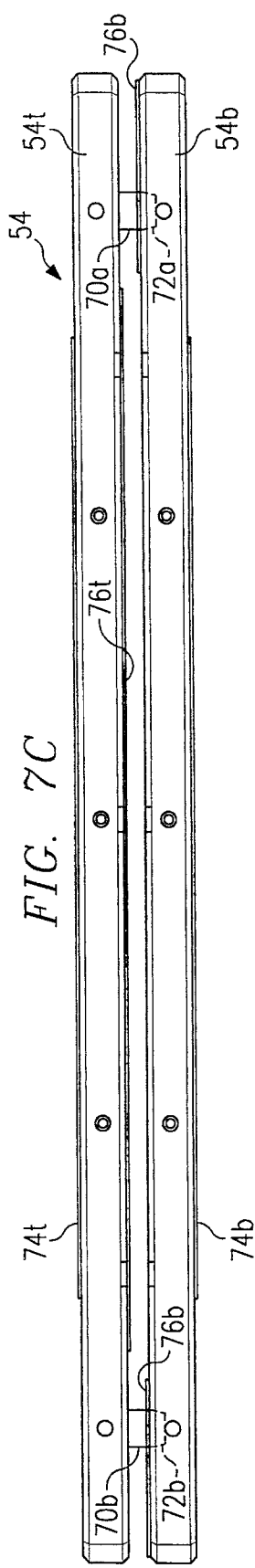
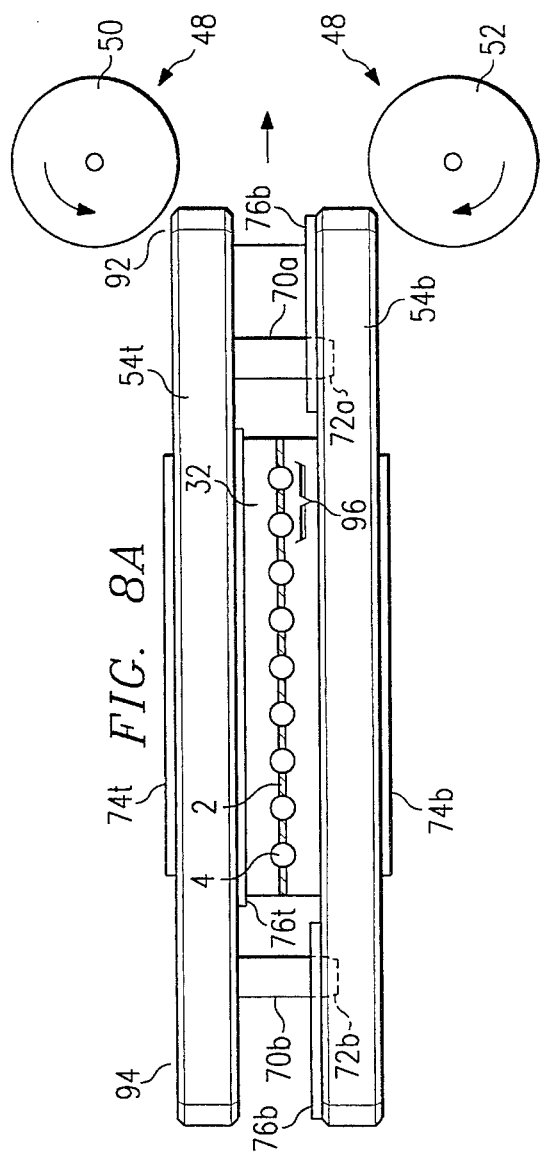
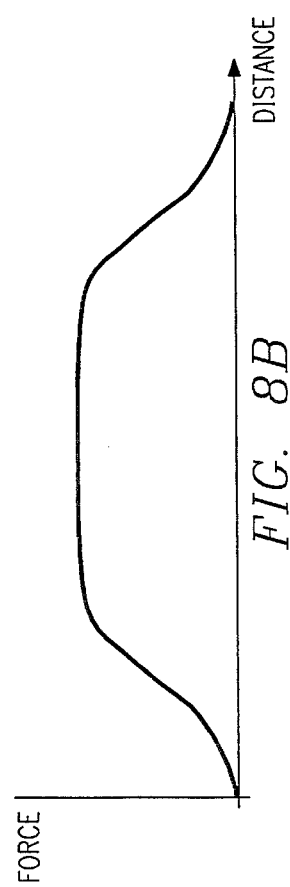

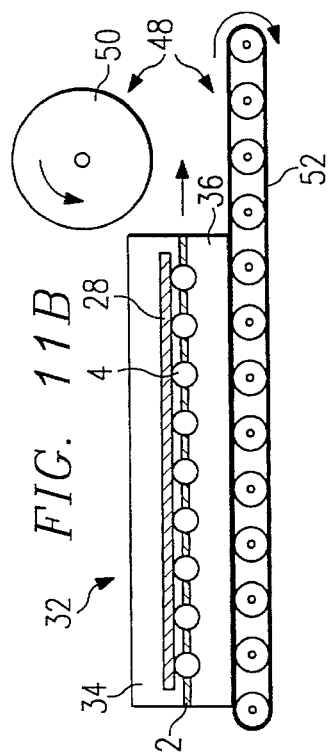
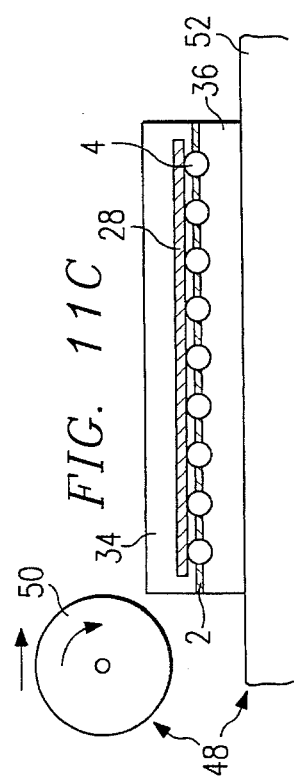
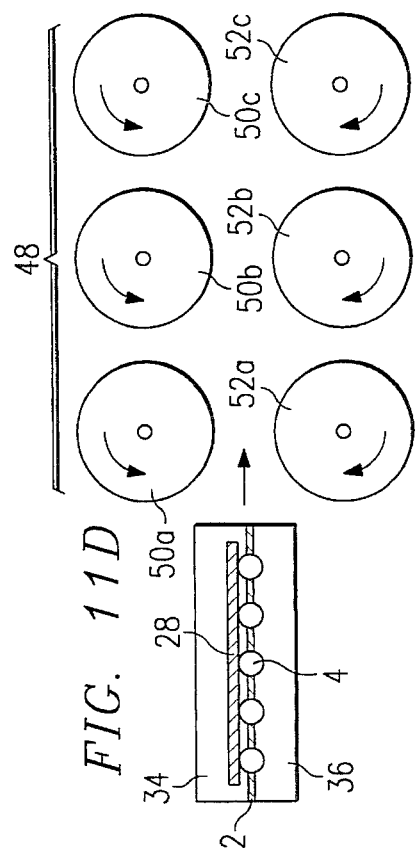
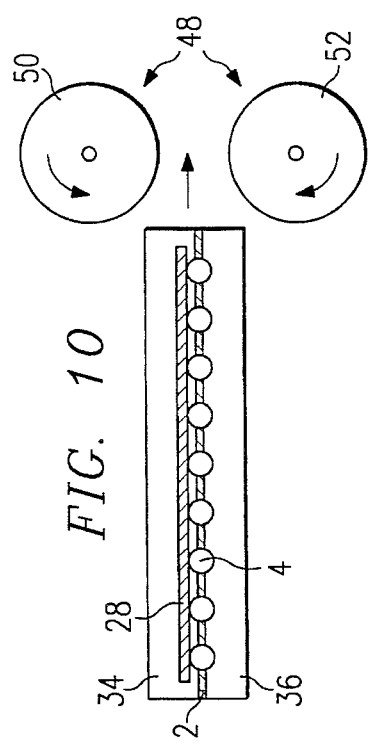
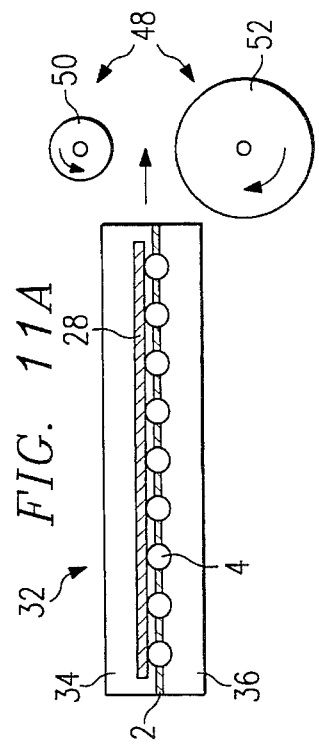

METHOD AND APPARATUS FOR AFFIXING SPHERES TO A CONDUCTIVE SHEET

CROSS-REFERENCE TO RELATED APPLICATIONS

The following U.S. patents and commonly assigned patent application are hereby incorporated herein by reference:

| U.S. Pat. or Ser. No. | Filing Date | Issue Date | TI Case No. |
| --- | --- | --- | --- |
| 4,407,320 | 09/08/81 | 10/04/83 | TI-8567 |
| 4,451,986 | 09/08/81 | 06/05/84 | TI-8912 |
| 4,614,835 | 12/15/83 | 09/30/86 | TI-9745 |
| 4,872,607 | 09/26/88 | 10/10/89 | TI-10621B |
| 4,917,752 | 09/11/86 | 04/17/90 | TI-10619A |
| 4,992,138 | 07/31/89 | 02/12/91 | TI-13836 |
| 5,028,546 | 07/31/89 | 07/02/91 | TI-14119 |
| 5,091,319 | 07/31/89 | 02/25/92 | TI-13835 |
| 08/270,320 | 07/22/94 | — | TI-14699 |

1. Field of the Invention

This invention generally relates to the fabrication of semiconductor devices to produce a solar cell and specifically to a method and apparatus for affixing semiconductor members to a conductive sheet.

2. Background of the Invention

A number of systems for converting sunlight to electricity are known. One such system that has proven useful in efficiently producing electricity from the sun's radiation is described in U.S. Pat. No. 4,691,076. In that system, an array is formed of semiconductor particles or spheres. Each sphere has a p-type interior and an n-type skin. A plurality of the spheres are held in a matrix which includes a pair of aluminum foil members which form the contacts to the p-type and n-type regions. The foils are electrically insulated from one another and are flexible. Multiple flexible and conformable arrays can be electrically interconnected to form a module of solar cell elements for converting sunlight or other forms of photon energy into electricity.

In order to produce sufficient quantities of reasonably priced arrays, it is necessary to utilize a process for their manufacture that is uncomplicated, low cost and efficient. An uncomplicated system would be one using currently available technology in such a way that the applicable process steps can be conducted in a highly repeatable manner. Moreover, the less complicated the process steps, generally, the more cost effective will the entire process be carried out. Finally, the more repeatable the process, the more efficiently the operation and the higher the production of solar arrays.

A key process in making solar cells is forming a highly conductive or good ohmic contact between a semiconductor sphere and a foil sheet. One process for making this contact is disclosed in U.S. Pat. No. 5,028,546 ('546). In the '546 patent, a pad is formed on each, of the spheres. The foil sheet is then affixed to this pad. However, it would be desirable to replace this two step process with a single step process which obtains good ohmic contact and lends itself to methods of mass production.

SUMMARY OF THE INVENTION

An improved method of affixing spheres to a conductive sheet or foil is described herein. A cell matrix is provided. The cell matrix includes a conductive foil matrix with spheres mounted therein. Each of the spheres has an insulating layer disposed on one side. A portion of this insulating layer is removed from each of the spheres to expose a portion of the spheres. A cell sandwich is then formed between an upper pressure pad and a lower pressure pad. The cell sandwich includes the cell matrix and a second conductive foil. The cell sandwich is then heated (preferably to between about 350° and 450° C.). The spheres are then affixed to the second conductive foil by compressing the cell sandwich. In one embodiment, the compression takes place in a roll press.

The present invention has a number of advantages over prior art methods. For example, the method disclosed in the '546 patent requires two steps to contact the sphere to the foil. First a pad is affixed to the sphere; then the pad is affixed to the foil. In the present invention, on the other hand, the contact is performed in a single step. The elimination of one step saves time and money and therefore is desirable.

Another advantage of the invention is that it provides a process flow which is more conducive to a continuous throughput when a roll press is used. Unlike a vertical press, the foil matrix can be continuously run through the roll press regardless of the length of the cell being produced. This feature enhances manufacturability and therefore reduces costs.

In addition, a roll press provides a more uniform pressure than a vertical press since the forces are applied to a significantly smaller surface area at any given time. Whereas a process using a vertical press applies pressure to the entire cell (or at least a selected portion of the cell) at the same time, a roll press allows the cell to be compressed by compressing a few rows of spheres at a time. It is much easier to uniformly control the pressure along a few rows of spheres than throughout the entire cell.

In addition, the rate of pressure application is important. The faster the force is applied, the better the bond strength will be. Rollers can generally provide faster rates of application compared to a hydraulic press.

BRIEF DESCRIPTION OF THE DRAWINGS

The above features of the present invention will be more clearly understood from consideration of the following descriptions in connection with accompanying drawings in which:

FIGS. 1a–1f are schematic diagrams of the solar cell after each of the processing steps in a general process flow;

FIGS. 4a–4c illustrate variations of preferred embodiment cell sandwiches;

FIGS. 5a–5b illustrate two variations of a cell sandwich formed within a clamshell;

FIGS. 7a–7c illustrate a second embodiment clamshell;

FIG. 8a illustrates a cell being processed using a clamshell as in FIGS. 7a–7c;

FIG. 8b illustrates a force profile over distance for a clamshell with a stepped plate;

FIGS. 9a and 10 illustrate the preferred method for back bonding the solar cells.

FIG. 9b illustrates a force versus time cycle for back bonding solar cell in vertical press shown in FIG. 9a.

FIGS. 11a–11d illustrate variations of the roll press which is used in the rolling process of the present invention;

Corresponding numerals and symbols in the different figures refer to corresponding parts unless otherwise indicated.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. A brief overview of the process of forming a solar cell will first be described. A preferred embodiment of affixing a spherical member to a conductive sheet will then be described.

Referring to FIGS. 1a–1f as well as other figures, a solar cell is illustrated after selected processing steps in an exemplary process flow.

Initially, as shown in FIG. 1a, a flexible conductive foil 2, or "front foil", preferably aluminum with from about 0.5% to 1.5% (preferably about 1.0%) silicon by weight, of about three mil thickness is provided (herein a mil is one thousandths of an inch). Foil 2 has a native oxide layer (typically about 50 Å in thickness) on its surface due to its exposure to oxygen-containing environments. While the description herein will be with respect to three solar array members or spheres 4, it should be understood that a multiplicity of array members 4 is provided in the total array as is exemplified by the prior art noted above. A completed array of spheres 4 within a matrix which includes foil 2 is referred to as a cell. In other words, a cell comprises a plurality of spheres 4 each coupled to two sheets 2, 28 (FIG. 1f) of conductive foil.

Figure 2A:
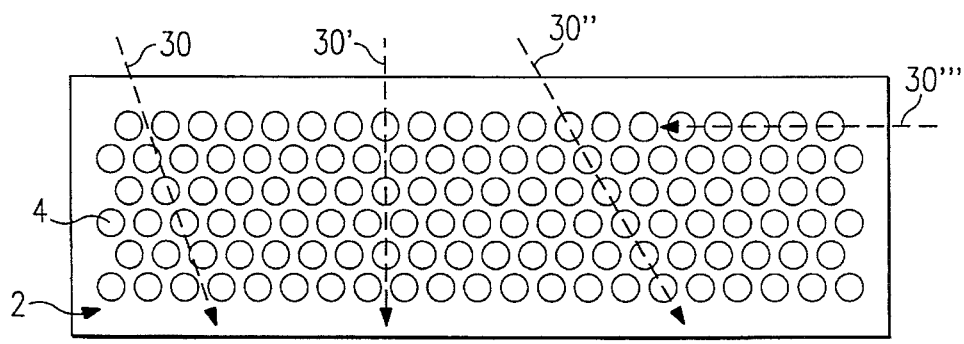
FIG. 2a illustrates the configuration of solar members or spheres formed on a foil matrix.

The aluminum foil 2 may be initially embossed. The embossments may reside in a periodic hexagonal arrangement, on selected centers as illustrated in FIG. 2a. For example, the embossments may reside on 16 mil centers for spheres with 14.5 mil diameters or 32 mil centers for 30 mil diameter spheres. The diameter of the embossed region is slightly smaller than the diameter of doped silicon particles or spheres 4 to be held thereby. The embossments may be circular or any other convenient geometrical shape such as hexagonal or octagonal. In the case of polygonal embossments, a line across the polygon through its center is less than the diameters of the spheres 4 to be applied thereto. Alternatively, the foil 2 can also be stamped or punched to form the holes 6.

Figure 2B:
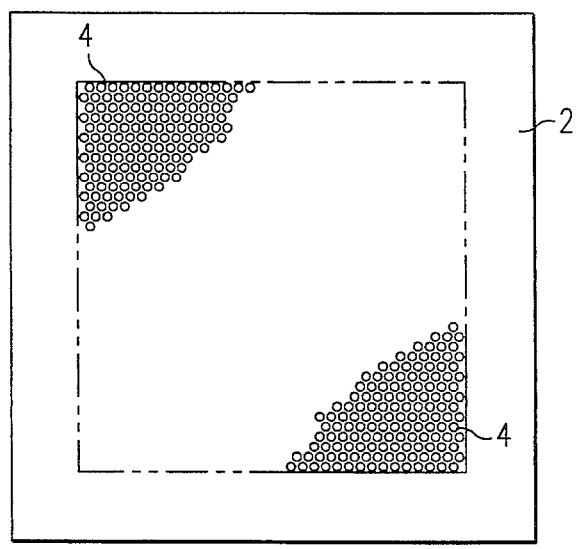
FIGS. 2b–2c illustrate two of the solar cell shapes produced by the steps outlined in FIGS. 1a–1f.
Figure 2C:
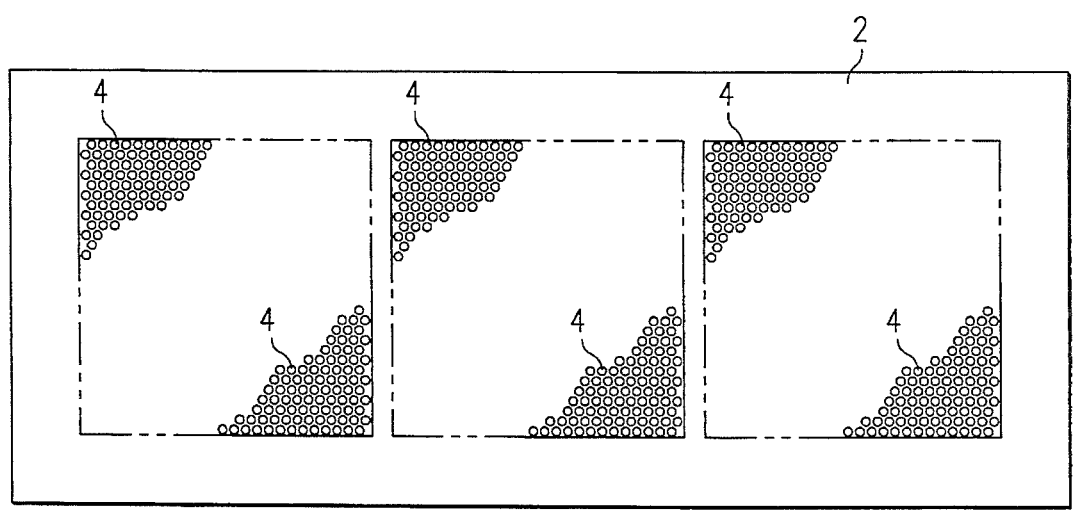

Several solar cell shapes having aperture areas arranged in a periodic hexagonal pattern have been successfully built and tested. The planar aperture areas have ranged in size from 0.1 cm$^2$ to 300 cm$^2$. FIG. 2b shows an example of a single cell design. In a typical application, a cell such as the one in FIG. 2b may have dimensions of 3.16 cm×3.16 cm (10 cm$^2$) or 10 cm×10 cm (100 cm$^2$). FIG. 2c illustrates a second variation that contains three 10 cm×10 cm (300 cm$^2$) cells contiguously arranged on a single foil matrix 2.

The embossed foil 2 is next optionally cleaned to remove organics and is then etched with heated sodium or potassium hydroxide to remove the region of the foil 2 where the thinned embossments reside to provide apertures 6 through foil 2. The etched foil 2 including the plurality of apertures 6 is referred to as a foil matrix.

At this point, the foil 2 can optionally be textured by etching with a fifty percent solution of 39A etchant, which is thirteen percent hydrofluoric acid, thirty-eight percent nitric acid, twenty-one percent acetic acid and twenty-eight percent water, to provide a matrix surface that minimizes back reflections.

An excess of doped silicon spheres 4 are deposited over the frontside 14 of the matrix or foil 2 and negative pressure may be applied to the backside 16 of the foil 2 with a vacuum chuck (not shown) to partially draw the spheres 4 into, and to hold the spheres 4 in, the apertures 6. Because an excess of spheres 4, relative to the number of apertures 6, is preferably initially utilized on the foil 2 frontside 14, all of the apertures 6 will be filled with the spheres 4 and the excess spheres 4 are then removed. Doctoring techniques may be utilized to achieve the foregoing.

Although there is no limit to the size or shape of the members 4 which can be used with the present invention, the members 4 which have been utilized are substantially spherical particles which are about 14 to 34 mils in diameter. The apertures 6 as explained above, have diameters of something less than that of the spheres 4. The spheres 4 preferably include p-doped cores 12 surrounded by an n-doped layer or skin 10. These conductivities may, however, be reversed. Following loading of apertures 6 with the spheres 4, the spheres 4 are then bonded to the walls of the apertures 6, as shown in FIG. 1b. This bonding step is referred to as "front bond". The front bond process is described in further detail in co-pending application Ser. No. 08/279,320 (TI-14699), incorporated herein by reference.

Figure 3A:
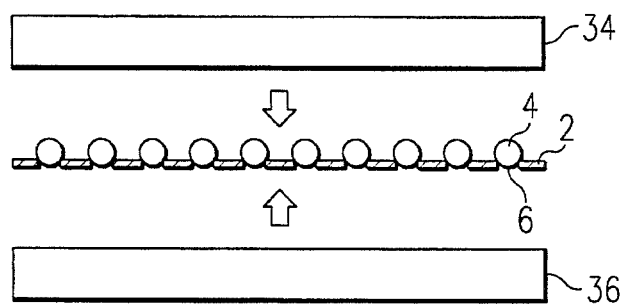
FIG. 3a illustrates a cell sandwich which can be utilized for the front bond process.

Referring now to FIG. 1b, the sphere 4 may be disposed in the aperture 6 so that its centerline is at or slightly above or forward of the frontside 14 of aluminum foil 2. This disposition of the spheres 4 may be effected by the use of pressure pads 34, 36 (FIG. 3a) which are disposed above and below the aluminum foil 2 and may be pressed against the foil-sphere 2-4 combination. The pressure pads 34, 36 may be formed of aluminum foil from about 1 mil to about 8 mils thick and coated with a release agent. The release agent is a relatively thin (about 0.010" or less in thickness) coating either applied or formed on the base material of the pressure pads to prevent the pressure pad from either adhering or sticking to other materials, particularly other parts of the cell sandwich 32 such as the foil matrix 2 and silicon spheres 4. Also mechanically abrading and/or chemically etching the surface of the pressure pads to modify their surface finish or surface topography may by itself or in combination with the release coating assist in preventing the adherence of other materials. The pressure pads 34, 36 act as a cushion to mitigate damage to spheres 4 during package deformation. The pressure pads also allow the spheres 4 to move against something compliant.

FIG. 1b illustrates the foil 2 as being coincident or aligned with the centerline of sphere 4. It should be noted, however, that this is not necessary. In fact, it is desirable for the foil 2 to be sufficiently "below" the centerline to maximize the surface area of the n-type skin layer 10 on which photon energy may impinge. The relationship of the foil 2 depends on the amount of p-type core region 12 which must be exposed "below" the backside 16 of the sheet 2 for bonding to second foil sheet 28 (as in FIG. 1f). It has been practically determined that affixing the foil sheet 2 about 55% of the way "below" the pole of the sphere 4 provides a reasonable tradeoff.

Figure 3B:
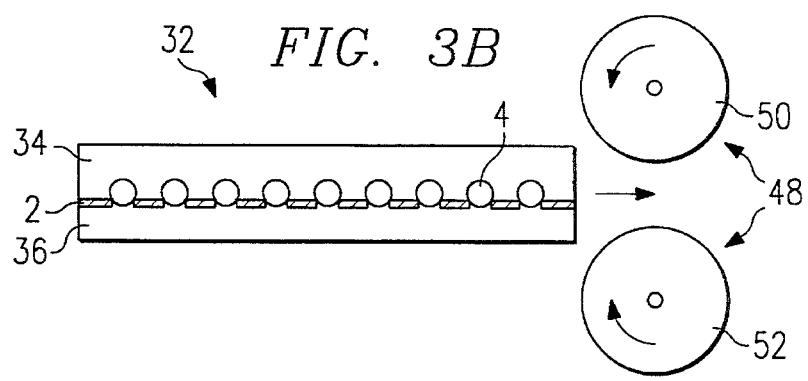
FIGS. 3b and 3c illustrate a preferred method for front bonding the solar cells.
Figure 3C:
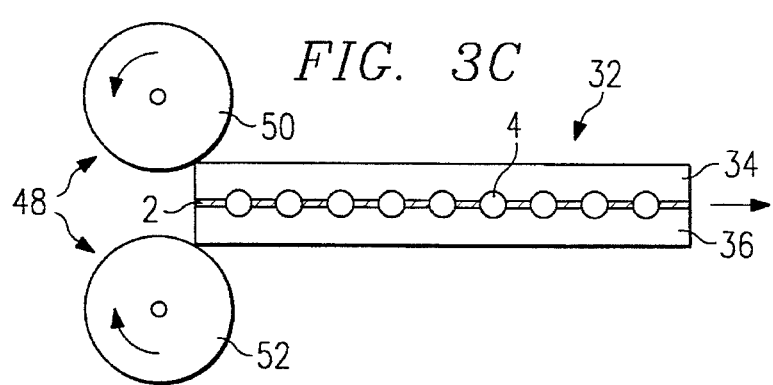

To affix the spheres 4 to the foil 2, the cell sandwich 32 is first heated. In the preferred embodiment the temperature is between about 500° C. and about 540° C., preferably about 530° C. The upper temperature is limited only by the temperature at which the aluminum mobility increases so that it spikes into the p-type core 12 thereby shorting the cell member. Once the cell sandwich 32 reaches the desired temperature, the spheres 4 are affixed to the foil 2 by directing the cell sandwich 32 through a roll press 48 as illustrated in FIGS. 3b and 3c. The cell sandwich 32 is compressed between a top roller 50 and a bottom roller 52. The combination of the pressure applied by the roll press 48 and the elevated temperature of the spheres 4 and foil 2 will cause the sphere 4 to become bonded to the foil 2.

In an alternate embodiment, the cell sandwich 32 is compressed while still at room temperature. The foil matrix 2 (including spheres 4) can later be heated to complete the bonding process. This alternative provides a significant advantage since the compression process can be performed at room temperature.

Referring now to FIG. 1c, the rear surface or backside 16 of the foil 2 and the portion of sphere 4 protruding therebelow are then etched using any of planar (18% acetic acid, 52% nitric acid, 26% deionized water, and 4% hydrofluoric acid), hydrofluoric acid/nitric acid mixtures (HF/HNO$_3$), or 39A etchant (approximately 13% hydrofluoric acid, 38% nitric acid, 21% acetic acid and 28% water). As shown in FIG. 1c, the n-type layer 10 on the surface of sphere 4 which is adjacent to rear surface 16 of foil 2 is removed, thereby exposing the p-type region 12. The aluminum foil 2 acts as a mask to the etchant permitting only the portion of the layer 10 which is "below" the rear side 16 of the array to be removed. The n-type skin layer 10 "above" the frontside 14 may also be partially etched after (or simultaneously with) back etch to thin the p-n junction which increases current output of the cell. The array is then rinsed with water to remove etchant. As shown in FIG. 1d, an insulative layer 20, preferably a polyimide coating such as Kapton® or Pyralin® (both available from DuPont), is applied to the backside 16 of foil 2 and to the exposed p-type region 12 of the sphere 4.

In FIG. 1e, a small region of polyimide coating 20 may be removed to expose a portion of the p-type material 12 of sphere 4 through an opening 22. This step may be performed by selective abrasion, such as by passing the cell under a rotating brush with silicon carbide coated (320 grit) bristles. For example, the bristles may be made from nylon, 0.018 inches in diameter and 0.875 inches long. A deburring machine with these bristles is available from Atotech (e.g., Model 604).

In the next step, the array undergoes an anodizing process to isolate shorted members or spheres. In the process, the array is immersed in a diluted hydrofluoric acid (HF) bath with a potential difference of approximately 0.5 volts between the n-type region 10 and the p-type region 12 (i.e., the anode and cathode). The anodization process takes approximately 30 to 120 seconds to provide a sufficient insulative coating (not shown) on the exposed p-type core 12 of a shorted sphere 4. This insulative coating isolates the sphere 4 from a back foil 28 (see FIG. 1f).

After the anodization process, a titanium dioxide coating (not shown) is formed on the n-type skin 10 of spheres 4.

The titanium dioxide coating serves as an anti-reflection coating. Other materials can also be used as anti-reflection coatings.

In FIG. 1f, a thin aluminum foil 28, or "back foil", of about 0.3 to 1.0 mil thickness is then positioned under each of the spheres 4. The aluminum and cell package 2-4-28 is heated to a temperature in the range of about 350° to 450° C., preferably about 420° C. The heated foil 28 is then pressed against the contact 26 or the exposed p-type core 12 to bond them together.

In one embodiment of the present invention, the foil 28 is bonded directly to the sphere 4. In other words, the electrical contact 26 is integral with the foil 28. This process replaces the two step sequence of bonding the electrical contact 26 to sphere 4 and then bonding the foil 28 to the electrical contact 26 as described in U.S. Pat. No. 5,028,546. This so-called back bond process will now be described.

Referring now to FIG. 4a along with FIG. 1f, a cell matrix including conductive foil matrix 2 with spheres 4 mounted therein is provided. Each sphere 4 has an insulating layer 20 disposed thereon. As discussed with respect to FIG. 1e, a portion of this insulating layer 20 has been removed to expose a contact portion 22 of each sphere 4. The exposed portion 22 of the sphere 4 is affixed to the second conductive sheet 28 by compressing a cell sandwich 32.

The cell sandwich 32 is formed and includes upper pressure pad 34, cell matrix (i.e., foil matrix 2 with affixed spheres 4), conductive back foil 28 and lower pressure pad 36. The cell may be a 300 cm$^2$ as shown in FIG. 2c. As for the front bond, the pressure pads 34 and 36 act as a cushion so that the spheres 4 are not damaged during compression. The pressure pads also allow the spheres 4 to move against something compliant.

FIG. 4b illustrates a first of the many pressure pad configurations which can be utilized for the back bond process. The layers illustrated in FIG. 4b are summarized in Table 1.

TABLE 1

| Element | Material | Dimensions (inches) |
| --- | --- | --- |
| Upper Pad 34 | Stainless steel 60 (oxidized) | 6.0 × 14.375 × 0.002 |
|  | Plaster 62 | 6.0 × 14.375 × 0.001 ± 0.0005 |
| Back Foil 28 | Aluminum | 6.00 × 12.125 × 0.0005 |
| Lower Pad 36 | Aluminum 64 (oxidized) | 6.0 × 14.375 × 0.002 |
|  | Oxide on Aluminum 64 | –0.000060 thick |
|  | Aluminum 66 (oxidized) | 6.0 × 14.375 × 0.008 |
|  | Oxide on Aluminum 66 | –0.000020 thick |
|  | Stainless steel 68 (oxidized) | 6.0 × 14.375 × 0.002 |

One or all of the aluminum sheets 64 and 66 may have an oxide layer (not shown) formed thereon. If present, the oxide layer (not shown) may typically be about 20 to 120 microinches thick.

Although not illustrated, it should be noted that both sides of the aluminum sheets 64 and 66 and stainless steel sheets 60 and 68 can be coated with release coat layers.

A satisfactory oxide thickness can be grown on the stainless steel sheets 60 and 68 by heating the sheets in air in a furnace or oven controlled to about 500° C. for about twenty minutes.

An alternate embodiment cell sandwich is illustrated in FIG. 4c. In this embodiment, a plaster (e.g., calcium sulfate CaSO$_4$) layer 63 (e.g., with dimensions of 6.00"×14.375"×

0.001"±0.0005") is included on aluminum layer 64. In addition, the stainless steel layer 68 can be eliminated (as shown) if the oxide thickness on aluminum layer 66 is increased to about 0.000120".

Although described herein as comprising aluminum sheets 64 and 66 with plaster release coat 63, the pressure pad 36 may consist of a wide variety of materials. Generally, the materials should possess as many of the following characteristics as possible: 1) be able to withstand the necessary temperatures (e.g., 350° C. or above) without decomposing or losing structural integrity, 2) possess deformation characteristics comparable to aluminum, 3) be available at low cost, 4) prevent sticking to the spheres 4, foil matrix 2, back foil 28, and other pressure pads, for example, by allowing plaster or other release agents to adhere or permit formation of oxide release coatings, 5) withstand compressive forces/pressure required without structural failure, 6) exhibit no outgassing at the temperature of interest, and 7) possess thermal expansion characteristics comparable to aluminum.

In another alternate embodiment, the release coat layers 62 or 63 may be constructed by mixing 20 ml printer's ink, 20 ml ethylene-glycol, 6 grams of boron nitride and 6 grams of silica. Additional ethylene-glycol can be mixed in the foregoing to achieve the desired consistency. Alternate materials for the release coat layers include, but are not limited to, ceramic coatings such as aluminum oxide ($Al_2O_3$), magnesium oxide (MgO), and titanium dioxide ($TiO_2$). In addition, the pressure pads 34, 36 can include a layer of compressed graphite (not shown). The compressed graphite layer could comprise, for example, an off-the-shelf product such as Grafoil™ produced by Union Carbide.

Figure 6A:
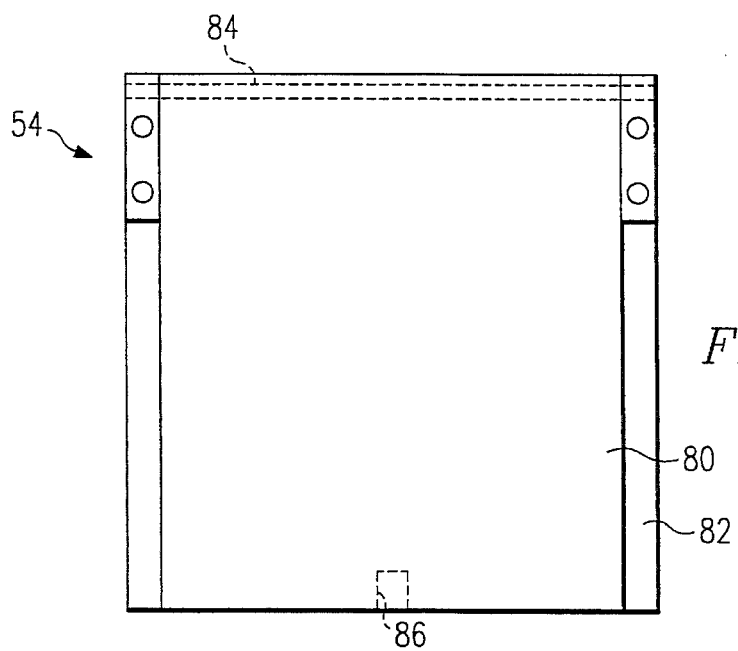
FIGS. 6a–6e illustrate a first embodiment clamshell.
Figure 6B:
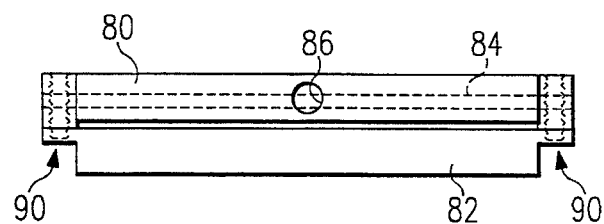
Figure 6C:
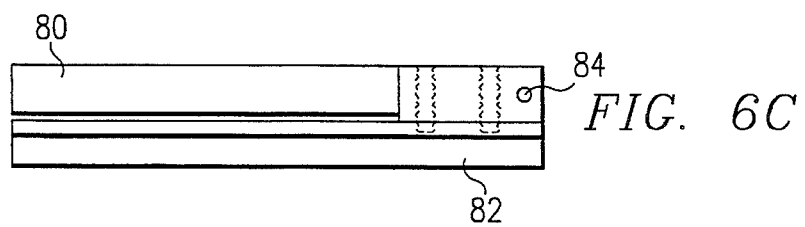
Figure 7A:
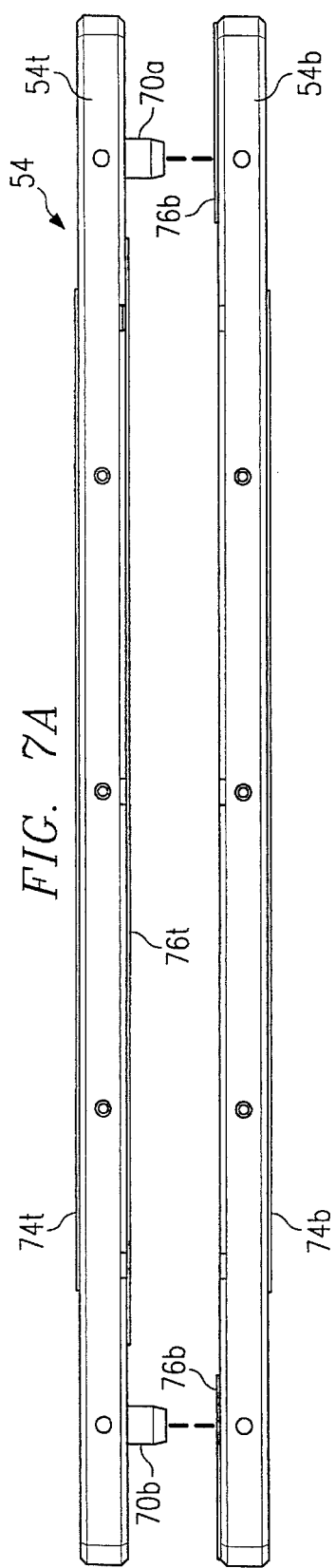
Figure 7B:
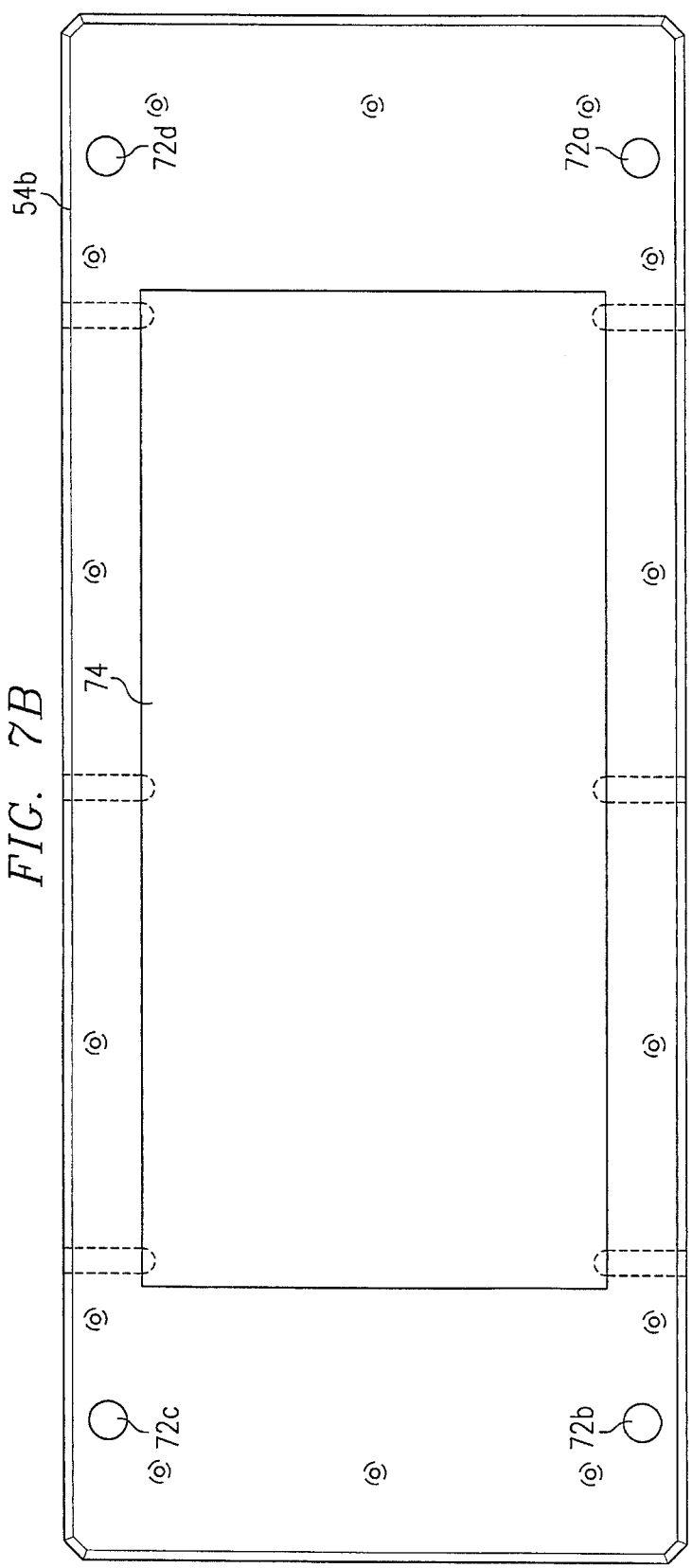

Referring now to FIG. 5a, in the preferred embodiment, the cell sandwich 32 is disposed within a "clamshell" 54 before the bonding process occurs. In this context, a "clamshell" refers to any fixture which includes a top plate 54t and a bottom plate 54b and encloses the cell sandwich 32 during the compression step. As illustrated in FIGS. 6a–6c, the clamshell 54 can include a hinged fitting 84 connecting the top and bottom plates 80 and 82 (thus the name "clamshell"). However, as illustrated in FIGS. 7a–7c, clamshells 54 which do not include the hinge have also been designed. Using a clamshell-like fixture in connection with a roll press may be referred to as "book rolling".

FIG. 5b illustrates one embodiment of a cell sandwich 32 which is disposed between top clamshell plate 54t and bottom clamshell plate 54b. In this embodiment, the top clamshell plate 54t is coated with a ceramic release coating. This coating will directly abut back foil 28 and eliminates stainless steel sheet 60. The release coating (not shown) which will prevent the cell sandwich 32 from sticking to the clamshell 54 during the heating and compression steps. For example, the clamshell 54 can be coated with a ceramic-like or similar coating, such as aluminum nitride (AlN), boron nitride (BN), titanium nitride (TiN), or chromium carbide (CrC), as examples. These coatings may impede an aluminum sheet (e.g., 28 or 67) from sticking to a steel clamshell.

Likewise, the surface texture or surface topography of the clamshell may also be modified by, for example, mechanical abrasion and/or chemical etching to prevent the cell sandwich 32 from sticking to the clamshell 54. This surface modification may be used singly or in combination with a variety of release coatings to prevent the sticking.

The lower pressure pad 36 includes oxidized aluminum layer 64 and raw aluminum layer 67. As with the top plate, bottom clamshell plate 54b is coated with a ceramic-like coating. This embodiment does not require stainless steel sheets.

The clamshell 54 typically comprises a hard, thermally conductive material such as steel. Steel alloys such as D2, M2 and H13 have been tried successfully. Other materials, such as stainless steel, inconel, titanium and tungsten, may also be good candidates. In the one embodiment, the clamshell 54 comprises a top plate and a bottom plate each of which are about twenty inches long by eight inches wide by one half inch thick. However, these dimensions may be varied according to the size of the foil 2. A more detailed drawing of two alternate clamshells 54 is shown in FIGS. 6a–6c and 7a–7c.

Figure 6D:
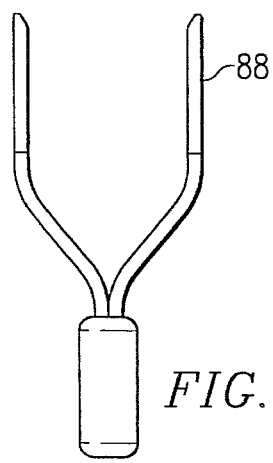
Figure 6E:

Referring now to FIGS. 6a–6c, a first embodiment clamshell 54 is illustrated. This "hinged" clamshell 54 may be used for bonding 10 $cm^2$ cells as in FIG. 2b. The clamshell 54 comprises two hardened (e.g., $R_c$=65, $R_c$ denotes Rockwell C hardness) steel plates 80 and 82 connected at the back by a steel hinge 84. The hinge 84 is disposed slightly below the plates 80 and 82. The hinge 84 should allow about 0.05 inches of slack between plates 80 and 82. The cell sandwich 32 may be placed between the top plate 80 and the bottom plate 82. The clamshell 54 may be opened by inserting a rod (not shown) into hole 86 and raising top plate 80 away from bottom plate 82. Transportation of clamshell 54 between a heating source and roll press (and vice versa) can be facilitated by inserting a tongued fork 88 (illustrated in FIGS. 6d and 6e) underneath overhang 90 of bottom plate 82.

A second embodiment clamshell 54 is illustrated in FIGS. 7a, 7b and 7c. This clamshell may be used for bonding 300 $cm^2$ arrays (e.g., as in FIG. 2c), for example. Top plate 54t includes four pins (two of which are illustrated in FIG. 7a and denoted as 70a and 70b) and bottom plate 54b includes four corresponding recesses 72a–d (as illustrated in FIG. 7b). The pins 70 are aligned so that they will fit within recesses 72 when the clamshell plates 54t and 54b are fit together as illustrated in FIG. 7c. In an alternate embodiment, only two pins which fit in corresponding recesses (e.g., 72a and 72c) may be used.

The cell sandwich 32 will fit between top plate 54t and bottom plate 54b during the compression process.

Returning to FIG. 7a, the clamshell 54 includes a number of features which enhance the performance of the bonding process using a roll press 48 (e.g., FIG. 8a). For instance, top plate 54t includes a step 74t on the outside of the plate. Similarly, bottom plate 54b includes a step 74b on the outside of the plate. However, this step 74b may not be necessary. In fact, tests have shown that acceptable bonding has been performed with a stepless bottom plate 54b.

Each plate 54b and 54t also includes a steel shim 76b and 76t, respectively. In one embodiment, the shims 76t for top plate 54t may be 14.2"×0.5"×0.048" and are positioned longitudinally on the underside of both sides (only one shim 76t is illustrated in FIG. 7a). In this example, the bottom plate shims 76b may be 7.80"×2.1"×0.062" and may be placed on the inside surface of the leading and trailing ends of bottom plate 54b as illustrated in FIG. 7a.

Referring to FIG. 8a, tests were made on the front bond process using a clamshell 54 which did not include steps 74a and 74b and shims 76t and 76b. In this case, the roll press 48 contacted the clamshell 54 at its leading edge 92. This action, along with the effects from the thickness of the cell sandwich 32, caused the upper and lower plates 54t and 54b to separate at the trailing end 94 thereby damaging the first few rows 96 of spheres 4 due to excessive pressure on these rows. Attempts at decreasing the force to avoid this damage resulted in incomplete bonds of the spheres 4 reaching the rollers 50 and 52 later in time.

The addition of the step 74 and shims 76 to the clamshell 54 has helped to eliminate this problem. In one embodiment, the edge of the step 74 is directly overhead of the first row of spheres 4. This approach delays application of pressure to the clamshell 54 and together with the shims 76 compensates for the thickness of the cell sandwich 32. The cell sandwich 32 resides inside the boundary formed by shims 76t and 76b. With both the step 74 and shims 76 functioning to minimize the amount of plate separation at the trailing end 94, the magnitude of the forces applied to the first spheres are lowered to a level where no damage occurs, but yet bonding of the spheres 4 to the front foil 2 occurs. A typical force profile along the length of the cell package for a clamshell comparable of the one in FIGS. 7a–7c is illustrated in FIG. 8b.

The benefits derived by the trailing end 94 from the inclusion of the step 74 and shims 76 to the clamshell 54 also applies equally well to the leading edge 92.

As discussed above, the cell sandwich 32 is preferably heated prior to the compression step. The cell sandwich is heated to a temperature in the range of about 350° to 450° C., preferably about 420° C. The heated foil 28 is then pressed against the contact 26 or the exposed p-type core 12 to bond them together.

Figure 9A:
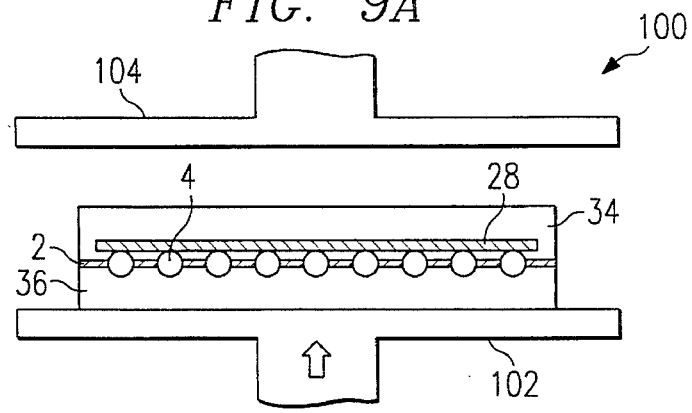

The compression step to form the back bonds can be performed by use of a vertical press 100 as illustrated in FIG. 9a. The vertical press 100 may be any one of a number of known presses such as a four-poster press made by Carver of Menomonee Falls, Wis. (e.g., Model No. 2629-X). A more detailed discussion of possible vertical presses is provided in U.S. Pat. No. 5,028,546 which is incorporated by reference.

In using the vertical press 100, the spheres 4 are affixed to the second conductive sheet 28 by compressing the cell sandwich 32 a plurality of times. For example, the cell sandwich may be compressed between about 5 and 20 times, preferably about 10 times for a 10 cm² cell and 15 times for a 300 cm² cell. It has been discovered that using multiple compressions or "bumps" of smaller magnitude as opposed to a single, higher magnitude compression results in improved adhesion between the conductive sheet 28 and the silicon sphere 4. The shearing forces created at the conductive sheet-sphere 28-4 interface, which are necessary for forming sound metallurgical bonds, are enhanced with the multiple compression approach. The multiple compression approach also yields cells with higher electrical outputs because the spheres 4 incurred less mechanical damage.

Figure 9B:
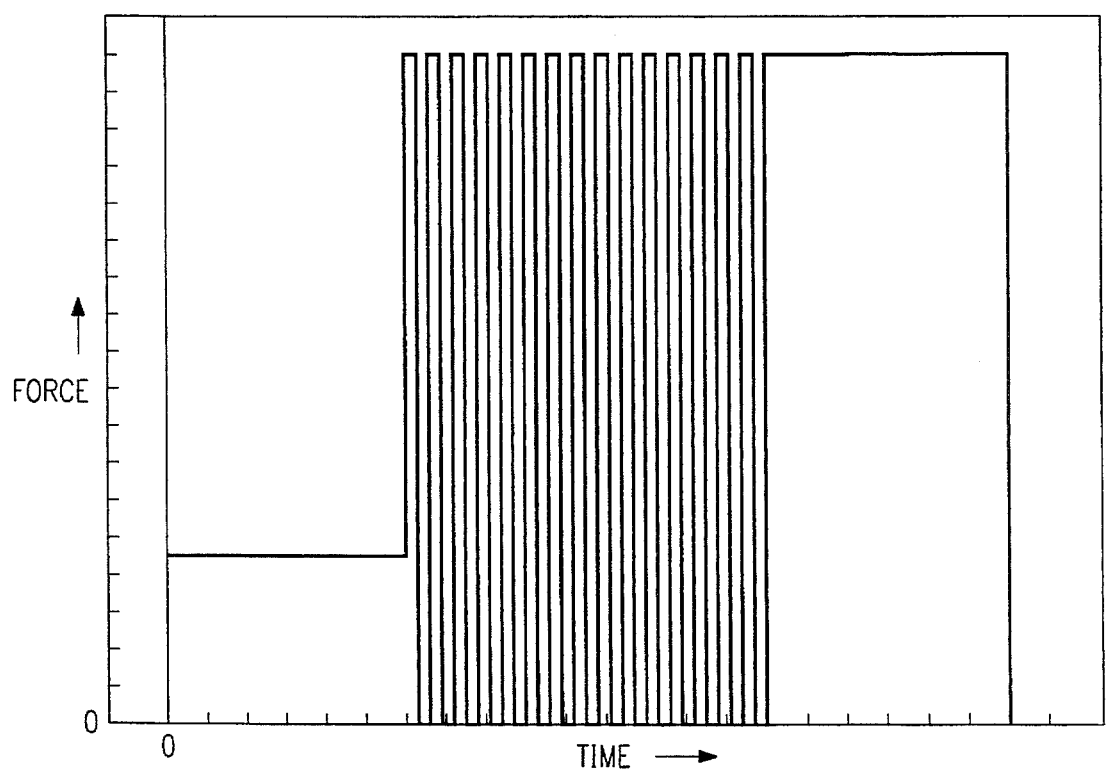

FIG. 9b illustrates the similarity of the force versus time relationship during the compression cycle to a mathematical step function. Prior to the compression step, the cell package 32 is heated from room temperature to about 420° C. To ensure good thermal contact between the cell sandwich 32 and the heated platens 102 and 104 of the vertical press 100 as illustrated in FIG. 9a, a light pressure of about 0.4 to 0.6 pounds force per sphere is applied to the cell sandwich 32 by exerting pressure on the bottom platen 102. No bonding of the second conductive sheet 28 to the silicon sphere 4 occurs during this stage. Following the heat-up period (e.g., 1 to 4 minutes), the force applied to the cell sandwich 32 is increased to the preset full scale rate and is held at this level for a dwell time of between 1 to 3 seconds. Then the force is quickly (nearly instantaneously) reduced to zero by slightly opening the platens. This cycle repeats itself for the 10 to 15 times required. After the last compression, the cell sandwich 32 is held at the full scale rate for a period of about 0.25 to 2 minutes, preferably about 1 minute, to further enhance the bonding of the second conductive sheet 28 to each silicon sphere 4.

Each compression at full scale should apply about 1.75 to 2.5 pounds force per sphere (preferably about 2.2 pounds force per sphere) on the cell sandwich 32. The compressions may be applied at a rate of between about 1 and 5 seconds between compressions.

In another embodiment, a roll press 48 as illustrated in FIG. 10 can be used to effect the compression process. As before, the combination of the pressure and the heat will cause the conductive sheet 28 to bond to the spheres 4. A back bond process which uses a roller press may not require that the cell sandwich 32 be compressed a plurality of times. In fact, test results on 300 cm² cells have found that passing the cell sandwich 32 through a roll press 48 only once can produce solar cells equivalent in electrical outputs to cells made by the multiple compression vertical press process. However, if necessary, multiple, compressions can be accommodated with the roll press 48 shown in FIG. 11d. FIG. 11d demonstrates that the roll press 48 can include more than one top roller 50a–c and/or bottom roller 52a–c. Each of these rollers can have the same radius or varying radii. These type of roll presses are known as tandem rolling mills. As the cell package passes through the tandem rolling mill, each set of top and bottom rollers is equivalent to a compression. For example, if ten compressions is desired, a total of ten top and bottom rollers would be required.

It is important that the rollers 50 and 52 be parallel to one another so that each sphere within the row is compressed with the same amount of pressure. In the preferred embodiment, if the cell sandwich 32 (including clamshell 54 as in FIG. 7 is about 1.070 inches thick, the rollers 50 and 52 will typically be about 1.000 inches apart. This gap setting takes into account about 0.025 inches worth of play that exists in the roller bearings. This configuration will cause about 24,000 pounds of force to be applied to a portion of the sandwich 32 thereby compressing the spheres 4 into the second conductive sheet 28. It should be noted, however, that a process not using a clamshell 54 would require much less force for compressing the spheres 4 into the second conductive sheet 28.

In the preferred embodiment, the rollers 50 and 52 have the same diameter which is typically about 10 inches. In general, the diameter of roller 50 (or 52) may vary between about 3 and 18 inches depending on the amount of force required. The process, however, is limited by the size of the rollers 50 and 52. A smaller diameter is typically preferred since when the diameter is small, only a point contact will exist between roller 50 (or 52) and the cell sandwich 32. This feature provides an advantage as will be described below. However, rollers that are too small may impart an undesirable cuff or deformation to the cell sandwich 32 as it exits the roll press 48. Also the size of the rollers must be commensurate with the force required as the force applied by larger rollers is oftentimes more difficult to control.

The present invention provides a number of advantages over the prior art. In the preferred embodiment, only a few rows 30–30''' (see FIG. 2a) of spheres 4 are compressed at a time. In this manner, the pressure applied to the spheres 4 can be better controlled since the effective surface area being compressed at any given time is relatively small. In fact, as the diameter of the rollers 50 (or 52) is decreased, the surface area of contact will decrease further enhancing this characteristic. It is anticipated, however, that the present invention could utilize rollers which have a diameter of 15 inches or greater.

Although illustrated in FIG. 10 as including two rollers 50 and 52 of equal radius, the roll press 48 may include a variety of configurations. Four of these variations are illustrated in FIGS. 11a–11d.

In FIG. 11a, the top roller 50 has a smaller radius than that of bottom roller 52. In an another embodiment (not illustrated), the radius of bottom roller 52 may be smaller than that of top roller 50. It should be noted that the tangential velocities of the two rollers 50 and 52 are substantially equal so the cell package 32 is guided by the same speed at the top and bottom.

In the embodiment of FIG. 11b, the cell sandwich 32 is placed on a belt-conveyor or similar facility 52 and guided beneath top roller 50. This embodiment illustrates that only one roller may be used. Expanding upon that principle, FIG. 11c illustrates an embodiment where the cell package 32 is stationary and the roller 50 is moved over the cell package. In another variation, a heating element (not shown) can be included within the conveyor belt 52 (FIG. 11b) or surface 52 (FIG. 11c) for maintaining the high temperature of the cell sandwich 32.

Finally, FIG. 11d illustrates the roll presses known as tandem rolling mills which can be used to duplicate the multiple compression approach used with vertical press.

In an alternate embodiment, the rollers 50 and 52 may be heated. Heating the rollers 50 and 52, to about 425°–430° C. for example, may greatly facilitate bonding without a clamshell 54. The heated rollers would help to keep the cell sandwich 32 hot.

In another alternate embodiment, release coat layers may be applied or formed on the rollers 50 and 52 to prevent either the cell package 32 (when not using a clamshell) or the clamshell 54 from sticking or clinging to the rollers. As mentioned previously, the surface texture of the rollers can also be modified by, for example, mechanical abrasion and/or chemical etching to further aid in preventing this sticking.

The rollers 50 and 52 described above are typically cylindrical in appearance. Yet in alternate embodiment, these cylinder-like rollers can be shaped to include a wide variety of configurations. For example, a step can be machined into the top and/or bottom roller(s) 50/52, much like the step 74t (74b) included on the clamshell 54. This roller configuration may allow the use of flat, non-stepped clamshells. Different roller shapes may also prove useful when bonding without a clamshell 54. As another enhancement, the width of the rollers 50 and 52 can be selected to match, for example, the width of the cell in the case of no clamshell bonding or the width of the step in clamshell bonding.

When a clamshell 54 is used, it is typically preheated to avoid the relatively long time it would take to heat a structure with a high thermal mass. In the preferred embodiment, the clamshell 54 is held at about 400° C. to 450° C. The temperature should be held as close to the bond temperature as possible. The cell sandwich 32 is then loaded in at room temperature and the combination is then heated to the desired process temperature, e.g., 420° C.

As mentioned previously, prior to performing the compression step, the cell sandwich 32 may have light pressure applied to ensure good thermal contact between the clamshell 54 and the foil sheets 2 and 28. This intermediate pressure step can be performed using a vertical press 100 and is usually included when using heated platens of a vertical press as the heating source. This step can perhaps be avoided if the furnace design provides a good thermal environment for heating cell sandwich 32 and/or clamshell 54. When a clamshell 54 is heated using an infrared heating source, no intermediate pressure step is needed. The weight of the top plate 54t enhances good heat transfer.

In the preferred embodiment, the electrical contact 26 and the second conductive sheet 28 are formed from the same sheet of material. In an alternate (less preferred) embodiment, this process can be performed in two steps.

In the first step, the electrical contact 26 is formed by compressing a conductive sheet (preferably aluminum) as discussed herein. That is, the conductive sheet may be compressed by using either a vertical press 100 (FIG. 9a) or a roll press 48 (FIG. 10). The excess of the conductive sheet is then removed leaving a conductive pad (not shown) affixed to the core 12 of sphere 4.

A second conductive sheet 28 (preferably aluminum) is then positioned over the electrical contact 26. The aluminum sheet 28 and cell sandwich 32 are then heated to a temperature between about 400° C. and 450° C. (preferably about 420° C.). The heated sheet 28 is then compressed against the array as described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of affixing a conductive foil sheet to each of a plurality of semiconductor members mounted in a conductive foil matrix, said method comprising the steps of:

providing a cell matrix including said conductive foil matrix with said members mounted therein and an insulating layer disposed on each of said members;

removing a portion of said insulating layer from each of said members to expose a portion of said members;

forming a cell sandwich between an upper pressure pad and a lower pressure pad, said cell sandwich including said cell matrix and said conductive foil sheet;

disposing said cell sandwich within a clamshell;

heating said cell sandwich; and affixing said members to said conductive foil sheet by directing said cell sandwich within said clamshell through a roll press thereby compressing said cell sandwich.

2. The method of claim 1 wherein said semiconductor members comprise spheres.

3. The method of claim 1 wherein said upper and lower pressure pads each comprise a compliant sheet.

4. The method of claim 3 wherein a surface of said compliant sheet is modified so as to not adhere to other materials in said cell sandwich.

5. The method of claim 4 wherein said compliant sheet is coated with a release coat layer.

6. The method of claim 5 wherein said release coat layer comprises a plaster layer.

7. The method of claim 3 wherein said compliant sheet comprises an aluminum sheet.

8. The method of claim 1 wherein said upper pressure pad comprises a plurality of layers, said layers comprising:

a stainless steel sheet; and a plaster layer;

and wherein said lower pressure pad comprises a plurality of layers, said layers comprising:

a stainless steel sheet;

a first oxidized aluminum sheet; and a second oxidized aluminum sheet.

9. The method of claim 8 wherein said lower pressure pad further comprises a plaster layer abutting said second oxidized aluminum sheet.

10. The method of claim 1 wherein said heating step is performed prior to said affixing step.

11. The method of claim 1 and further comprising the step of disposing said cell sandwich within a clamshell prior to said heating step.

12. The method of claim 11 wherein said clamshell includes a stepped portion such that the thickness of said clamshell is not uniform.

13. The method of claim 11 wherein said clamshell includes a release coat layer formed upon a region which abuts said cell sandwich.

14. The method of claim 1 and further comprising the steps of:

removing excess of said conductive foil sheet leaving a conductive pad affixed to said exposed portion of each of said spheres;

affixing a second conductive sheet to said conductive pad of each of said spheres.

15. The method of claim 1 wherein said heating step comprises heating said cell sandwich to between about 350° and 450° C.

16. The method of claim 1 wherein said semiconductor members comprise silicon spheres having a p-type region and said conductive sheet is fused to said p-type region.

17. The method of claim 1 wherein said conductive foil sheet comprises aluminum.

18. In a method for making an array of solar cells comprising first and second conductive sheets coupled together by a plurality of semiconductor spheres, a method of connecting said second conductive sheet to each of a plurality of spheres mounted in said first conductive sheet, said method comprising the steps of:

providing a cell matrix including said first conductive sheet with said spheres mounted therein and an insulating layer disposed on each of said spheres;

removing a portion of said insulating layer from each of said spheres to expose a portion of said spheres;

forming a cell sandwich between an upper pressure pad and a lower pressure pad, said cell sandwich including said cell matrix and said second conductive sheet;

heating said cell sandwich; and affixing said exposed portion of said spheres to said second conductive sheet by compressing said cell sandwich a plurality of times at a selected pressure.

19. The method of claim 18 wherein said cell sandwich is heated to between about 350° and 450° C.

20. The method of claim 18 wherein said affixing step comprises the step of compressing said cell sandwich within a vertical press.

21. The method of claim 18 wherein said cell sandwich is disposed within a clamshell prior to said affixing step.

22. The method of claim 18 wherein said cell sandwich is disposed within said clamshell prior to said heating step.

23. The method of claim 18 wherein said step of removing a portion of said insulating layer is performed by selective abrasion.

24. The method of claim 23 wherein said step of removing a portion of said insulating layer comprises passing said cell matrix under a rotating brush with silicon carbide coated bristles.

25. The method of claim 18 wherein said selected pressure is applied at between about 1.75 and 2.5 pounds force per sphere.

26. The method of claim 18 wherein said cell sandwich is compressed between about 5 and 20 times.

27. The method of claim 18 wherein said cell sandwich is compressed at a rate of between about 1 and 5 seconds between compressions.

28. The method of claim 27 and further comprising the step of compressing said cell sandwich for about 0.25 and 2 minutes.

29. The method of claim 28 wherein said heating step comprises compressing said cell sandwich to a force less than the force used to perform said affixing step and heating said cell sandwich for between about 1 and 4 minutes.

* * * * *